(12) United States Patent
Nagamune et al.

(10) Patent No.: US 7,750,285 B2
(45) Date of Patent: Jul. 6, 2010

(54) OPTICAL SENSOR INCLUDING PHOTOCONDUCTIVE MATERIAL AND CARBON NANOTUBE

(75) Inventors: Yasushi Nagamune, Tsukuba (JP); Kazuhiko Matsumoto, Tsukuba (JP)

(73) Assignees: Japan Science and Technology Agency, Kawaguchi-shi (JP); National Institute of Advanced Industrial Science and Technology, Tokyo (JP)

( * ) Notice: Subject to any disclaimer, the term of this patent is extended or adjusted under 35 U.S.C. 154(b) by 1005 days.

(21) Appl. No.: 10/564,936

(22) PCT Filed: Jul. 15, 2004

(86) PCT No.: PCT/JP2004/010428
§ 371 (c)(1),
(2), (4) Date: Jun. 29, 2006

(87) PCT Pub. No.: WO2005/008787
PCT Pub. Date: Jan. 27, 2005

(65) Prior Publication Data
US 2007/0108484 A1    May 17, 2007

(30) Foreign Application Priority Data
Jul. 18, 2003 (JP) .............................. 2003-199225
Jul. 15, 2004 (JP) .............................. 2004-208456

(51) Int. Cl.
*H01L 31/00* (2006.01)

(52) U.S. Cl. ............................... 250/214.1; 250/214 R; 257/448; 977/932; 977/954

(58) Field of Classification Search ............. 250/214.1, 250/214 R; 257/448; 977/742, 932, 933, 977/954
See application file for complete search history.

(56) References Cited

U.S. PATENT DOCUMENTS

| 6,690,019 | B2 * | 2/2004 | Stettner et al. | 250/370.08 |
| 6,724,064 | B2 * | 4/2004 | Watanabe et al. | 257/459 |
| 2003/0047729 | A1 | 3/2003 | Hirai et al. | |
| 2003/0189235 | A1 | 10/2003 | Watanabe et al. | |

FOREIGN PATENT DOCUMENTS

JP   2003-517604 A   5/2003

(Continued)

OTHER PUBLICATIONS

R. Martel, et al. "Single- and Multi-Wall Carbon Nanotube Field-Effect Transistors", Applied Physics Letters, Oct. 26, 2000, pp. 2447-2449, vol. 73, No. 17.

(Continued)

*Primary Examiner*—Georgia Y Epps
*Assistant Examiner*—Francis M Legasse, Jr.
(74) *Attorney, Agent, or Firm*—Crowell & Moring LLP

(57) ABSTRACT

An optical sensor is characterized by comprising a photoconductive material (1) which generates a carrier (4) inside when irradiated with a light or an electromagnetic wave (3), and carbon nanotube (2), and by sensing the carrier (4), which is generated within the photoconductive material (1) by irradiation of the light or electromagnetic wave (3), through change of electrical conduction of the carbon nanotube (2).

15 Claims, 10 Drawing Sheets

FOREIGN PATENT DOCUMENTS

| | | | |
|---|---|---|---|
| JP | 2003-179234 | A | 6/2003 |
| JP | 2003-282924 | A | 10/2003 |
| JP | 2003-303978 | A | 10/2003 |
| WO | WO 01/44796 | A1 | 6/2001 |
| WO | WO 02/054505 | A2 | 7/2002 |
| WO | WO 2004/001395 | A1 | 2/2004 |

OTHER PUBLICATIONS

M. Shim, et al., "Photoinduced Conductiy Changes in Carbon Nanotube Transistors", Applied Physics Letters, Oct. 27, 2003, pp. 3564-3566, vol. 83, No. 17.

International Search Report dated Sep. 28, 2004 (Four (4) pages).

* cited by examiner

OPTICAL SENSOR INCLUDING PHOTOCONDUCTIVE MATERIAL AND CARBON NANOTUBE

TECHNICAL FIELD

The present invention relates to an optical sensor in which a photoconductive material or photoconductive materials are combined with a carbon nanotube or carbon nanotubes.

BACKGROUND ART

Generally, optical sensors are to convert energy of light or electromagnetic waves into electric energy. Background-art optical sensors include photodiodes, avalanche photodiodes, phototransistors, photo-MOSs, CCD sensors and CMOS sensors having semiconductor as their main components, photomultiplier tubes using photoelectric effect, etc.

Of the former semiconductor optical sensors, some are to extract output signal as electric current by converting carriers into the external electric current directly, where the carriers are electron or positive holes generated by irradiation with light. Others are to extract output signal as a modulation of majority electric-current, where the modulation is formed by a local electric field by the photo-generated carriers accumulated in a predetermined local place.

As proposals of sensors using carbon nanotubes or as reports about optical properties of carbon nanotubes, the following patent documents and non-patent documents can be listed.

(Patent Document 1) JP-A-2003-517604

(Non-Patent Document 1) J. Kong, N. R. Franklin, C. Zhou, M. G. Chapline, S. Peng, K. Cho, H. Dai, 'Nanotube Molecular Wires as Chemical Sensors', Science Vol. 287 (January 2000) P. 622-625

(Non-Patent Document 2) P. G. Collins, K. Bradley, M. Ishigami, A. Zettl, 'Extreme Oxygen Sensitivity of Electronic Properties of Carbon Nanotubes', Science Vol. 287 (January 2000) P. 1801-1804

(Non-Patent Document 3) I. A. Levitsky, W. B. Euler, 'Photoconductivity of single-wall carbon nanotubes under continuous-wave near-infrared illumination' Applied Physics Letters, Vol. 83 (September 2003) P. 1857-1859

DISCLOSURE OF THE INVENTION

Each of the aforementioned background-art optical sensors has to have complicated structures in which n-type and p-type semiconductors, metals, and insulators are combined. It is, therefore, difficult to produce such the optical sensors, and the optimum conditions such as doping conditions etc. are limited within narrow ranges. Eventually, there has been a problem that the yield is low, and the cost is high. Further, since the background-art semiconductor optical sensors are manufactured by epitaxial growth in which the range of selection as to materials is limited, there is another problem that the background-art semiconductor optical sensors have sensitivity only in a narrow wavelength range. On the other hand, since the latter photomultiplier tubes require a vacuum vessel, it is difficult to array or to form miniature photomultiplier tubes.

The contents disclosed in the aforementioned Patent Document 1 and Non-Patent Documents 1 and 2 show examples of carbon nanotubes used as sensors. However, the sensors are to detect gas, not to be used as optical sensors. Further, the contents disclosed in Non-Patent Document 3 show examples of measuring photocurrents in carbon nanotubes caused by irradiation on the carbon nanotubes with light. The principle of the above operation differs from that of the present invention as will be described later. In addition, the sensible wavelength range by the above operation is narrow and the sensitivity is low.

In consideration of such situation in the background art, an object of the present invention is to provide a novel optical sensor of which the manufacturing cost is low, while the optical sensor shows high sensitivity preferably with respect to abider wavelength range, exhibits high speed response, attains low power consumption, and has a structural principle by which the main portion of the optical sensor can be constructed easily.

The first means of the present invention for attaining the foregoing object is characterized by including a photoconductive material such as silicon, germanium, gallium arsenide, indium gallium arsenide, indium phosphide, etc. which generates a carrier inside when irradiated with a light or an electromagnetic wave, and a carbon nanotube provided correspondingly to the photoconductive material, and by sensing the carrier, which is generated within the photoconductive material by irradiation of the light or electromagnetic wave, through change of electrical conduction of the carbon nanotube.

The second means of the present invention is the aforementioned first means characterized by including a monolayer structure or a multilayer structure serving as the photoconductive material, which is made of a plurality of kinds of photoconductive materials having photoconductivity in different wavelength ranges, being selected, for example, from a group of silicon, germanium, gallium arsenide, indium gallium arsenide, indium phosphide, etc.

The third means of the present invention is the aforementioned first or second means characterized in that the multilayer structure includes layers of a photoconductive material having a wider energy gap at the side being irradiated with a light or an electromagnetic wave.

The fourth means of the present invention is any one of the aforementioned first through third means characterized in that a transparent or translucent insulating layer, for example, of silicon oxide is formed between the photoconductive material and the carbon nanotube.

The fifth means of the present invention is any one of the aforementioned first through fourth means characterized in that the optical sensor has a field effect transistor structure or a single electron transistor structure.

The sixth means of the present invention is the aforementioned fifth means characterized in that the field effect transistor structure is a structure in which a gate electrode is provided under the photoconductive material.

The seventh means of the present invention is the aforementioned fifth means characterized in that the field effect transistor structure is a structure in which a gate electrode is provided above the carbon nanotube.

The eighth means of the present invention is the aforementioned fifth means characterized in that the field effect transistor structure is a structure in which a gate electrode is provided near the carbon nanotube.

The ninth means of the present invention is any one of the aforementioned first through eighth means characterized in that electrodes connected to opposite ends of the carbon nanotube are provided, and the two electrodes have a comblike shape and are disposed to be opposed to each other, while a large number of carbon nanotubes including the carbon nanotube are connected in parallel between the two electrodes.

The tenth means of the present invention is any one of the aforementioned first through ninth means characterized in that a condenser is disposed on a side where the optical sensor is irradiated with the light or electromagnetic wave.

The present invention has the aforementioned configuration. It is, therefore, possible to provide an optical sensor manufactured in a simple method and having high sensitivity in a wide wavelength range.

BEST MODE FOR CARRYING OUT THE INVENTION

Next, embodiments of the present invention will be described with reference to the drawings. FIG. 1 are diagrams for explaining the principle of optical sensing of an optical sensor according to an embodiment of the present invention.

Figure 1A:
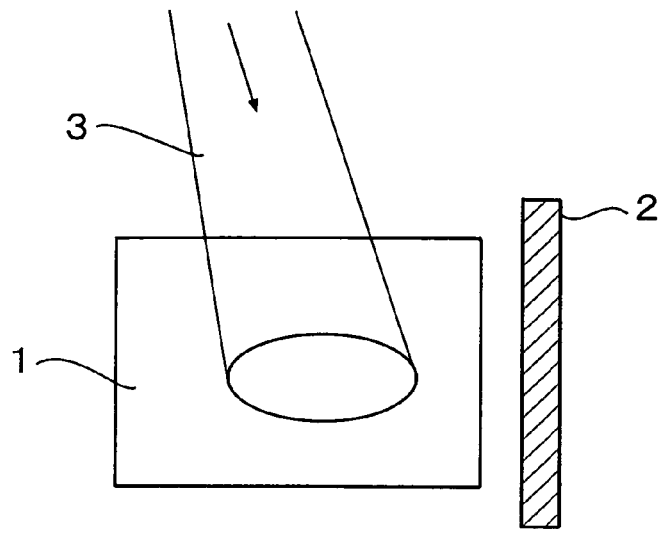
FIG. 1 are diagrams for explaining the principle of optical sensing of an optical sensor according to an embodiment of the present invention.
Figure 1B:
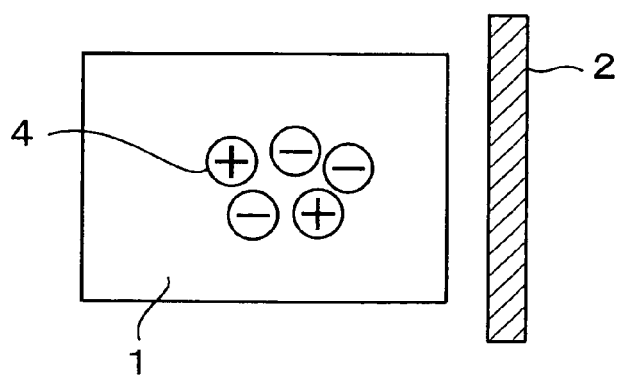
Figure 1C:
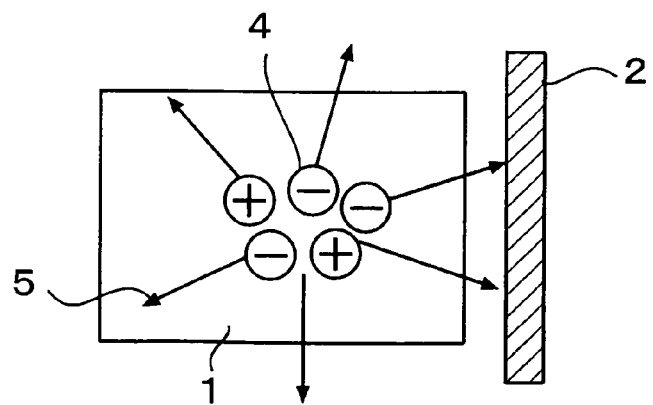

As shown in FIG. 1(a), a carbon nanotube 2 is placed near a photoconductive material 1. When this photoconductive material 1 is irradiated with light or an electromagnetic wave 3, carriers 4 are generated in the photoconductive material 1 as shown in FIG. 1(b). Electric fluxes 5 [see FIG. 1(c)] radiated by the carriers 4 act on electrical conduction of the carbon nanotube 2. Thus, the existence or intensity of the light or electromagnetic wave 3 with which the photoconductive material 1 is irradiated can be sensed as a change of electrical conduction of the carbon nanotube 2.

Accordingly, even when the number of carriers 4 generated by irradiation with the light or electromagnetic wave 3 is small, the electric fluxes 5 generated by the carriers 4 are sensed by the carbon nanotube 2, so that highly sensitive detection can be attained.

In addition, since the electric fluxes 5 extending over a long distance are sensed, no part for accumulating carriers locally is required. Thus, the optical sensor has a feature that no structure for accumulating carriers locally is required, or there is no additional power consumption to accumulate carriers.

Figure 2:
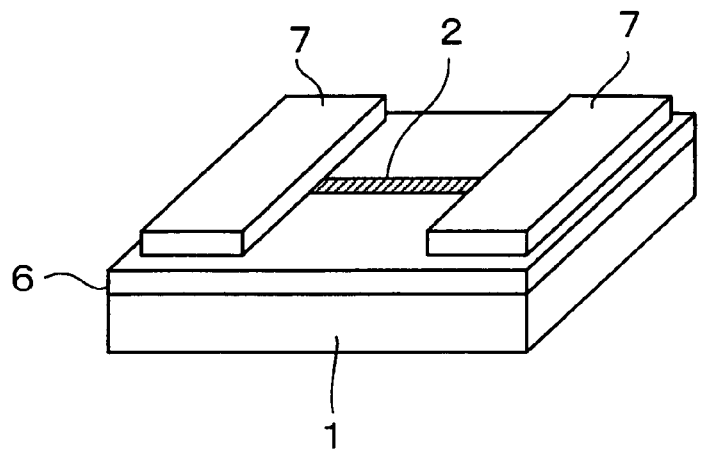
FIG. 2 is a perspective view of an optical sensor according to the first embodiment of the present invention.
Figure 3:
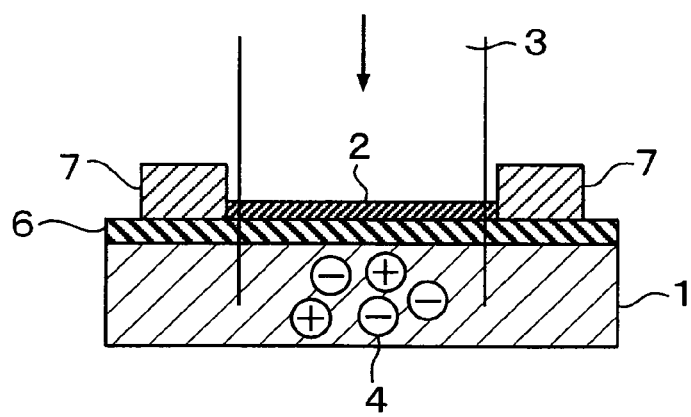
FIG. 3 is a sectional view of the optical sensor.

FIG. 2 and FIG. 3 are views for explaining the first embodiment of the present invention. FIG. 2 is a perspective view of an optical sensor, and FIG. 3 is a sectional view of the optical sensor.

As shown in these drawings, a carbon nanotube 2 is formed on a photoconductive material 1 through an insulating layer 6, and electrodes 7 and 7 for applying an appropriate voltage are provided in the opposite ends of the carbon nanotube 2.

In the case of this embodiment, a silicon substrate (photoconductive material 1) having photoconductivity is used, the insulating layer 6 of silicon oxide is formed thereon, and the carbon nanotube 2 is disposed thereon.

The photoconductive material 1 may be produced by crystal growth with a vacuum evaporation apparatus such as a molecular beam epitaxy apparatus (MBE apparatus), or a chemical vapor deposition apparatus (CVD apparatus) such as a metal-organic chemical vapor deposition apparatus (MOCVD). The photoconductive material 1 may be n-type, p-type, or semi-insulative.

As the insulating layer 6, a transparent or translucent material is used. As shown in FIG. 3, it will go well if carriers 4, which are generated from the photoconductive material 1 irradiated with the light or electromagnetic wave 3 through the insulating layer 6, are present in the photoconductive material 1. The carriers 4 do not have to flow into the carbon nanotube 2. As for the incidence direction of the light, the light may be incident on the bottom or side of the optical sensor.

Figure 4:
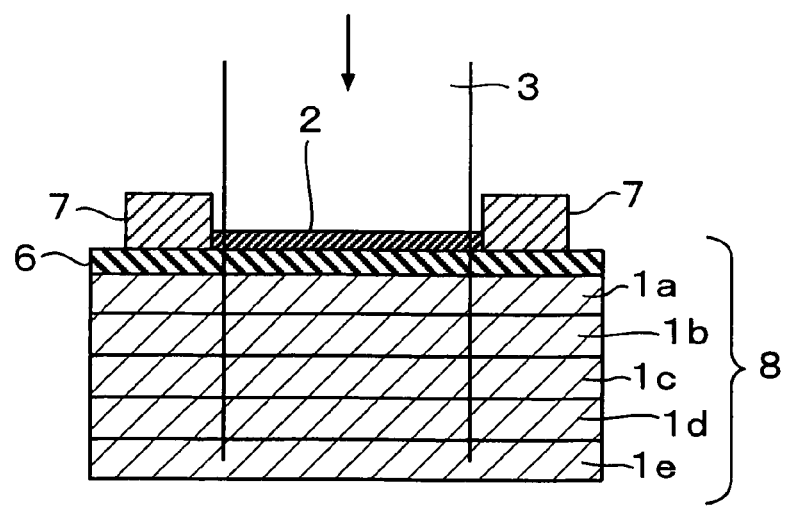
FIG. 4 is a sectional view of an optical sensor according to the second embodiment of the present invention.

FIG. 4 is a sectional view of an optical sensor for explaining the second embodiment of the present invention. This embodiment uses a multilayer structure 8 of a plurality of kinds of photoconductive materials 1a to 1e having photoconductivity in different wavelength ranges. In such a manner, it is possible to produce an optical sensor having sensitivity all over the photosensitive wavelength ranges of the respective photoconductive materials 1.

The photosensitive wavelength ranges in the photoconductive materials 1 will be shown below by way of example. Silicon (Si) ranges over 200-1,100 nm; germanium (Ge), 500-1,500 nm; gallium arsenide (GaAs), 200-900 nm; indium gallium arsenide (InGaAs), 650-2,900 nm; and indium arsenide (InAs), 1,300-3,900 nm.

Innumerable combinations can be set, for example, using aluminum arsenide (AlAs), aluminum gallium arsenide (AlGaAs), indium aluminum arsenide (InAlAs), gallium arsenide phosphide (GaAsP), indium gallium arsenide phosphide (InGaAsP), indium antimonide (InSb), mercury cadmium telluride (HgCdTe), lead selenide (PbSe), lead sulfide (PbS), cadmium selenide (CdSe), cadmium sulfide (CdS), gallium nitride (GaN), indium gallium nitride (InGaN), aluminum nitride (AlN), silicon carbide (SiC), etc. The sensitive wavelength varies in accordance with the combination (composition ratio) of the various photoconductive materials 1. It is proper to set the film thickness of each layer in a range of from several nanometers to several micrometers. When the film thickness is increased, the sensitive region volume is increased. However, when the film is too thick, it takes much time to form the film. Therefore, the aforementioned range is proper.

When the photoconductive materials 1 are irradiated with the light or electromagnetic wave 3 from above as shown in FIG. 4, it is effective to dispose a photoconductive material having a wider energy gap on the upper side in terms of effective use of the photoconductive materials 1. For example, an indium gallium arsenide (InGaAs) film, a gallium arsenide (GaAs) film and an aluminum arsenide (AlAs) film are laminated in that order from the bottom. However, the films do not be always disposed in such a manner, but the order of each film, the thickness of each film or the number of films may be set suitably in accordance with required optical response properties or individual material properties.

Although the multilayer structure 8 is used in this embodiment, a plurality of kinds of photoconductive materials 1 having photoconductivity in different wavelength ranges may be mixed suitably in accordance with required photoconductive properties or individual material properties, so as to form a single layer structure. An optical sensor having sensitivity all over the photoconductive wavelength ranges of the respective photoconductive materials 1 can be produced even by use of such a single layer structure.

In spite of a very simple configuration, the optical sensor according to the present invention is designed so that electric fluxes radiated from carriers generated by irradiation with light or an electromagnetic wave have influence on the electric conduction of a carbon nanotube placed through an insulating layer. Accordingly, irradiation with the light or electromagnetic wave can be sensed with high sensitivity.

Figure 5:
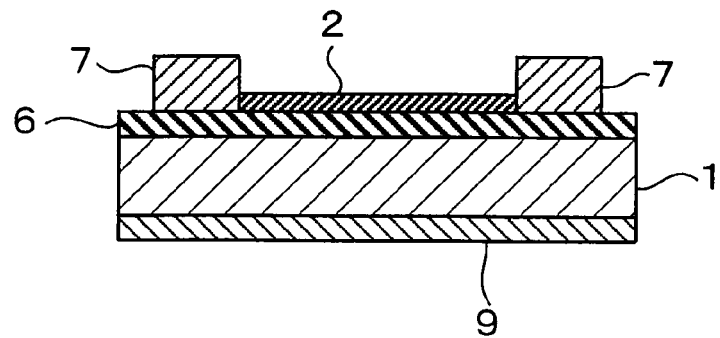
FIG. 5 is a sectional view of an optical sensor according to the third embodiment of the present invention.

FIG. 5 is a sectional view of an optical sensor for explaining the third embodiment of the present invention. In this embodiment, a gate electrode 9 is provided under a photoconductive material 1 so as to form a field effect transistor structure.

Figure 6:
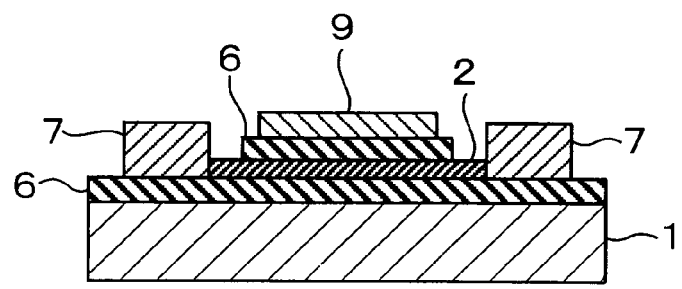
FIG. 6 is a sectional view of an optical sensor according to the fourth embodiment of the present invention.

FIG. 6 is a sectional view of an optical sensor for explaining the fourth embodiment of the present invention. In this embodiment, a gate electrode 9 is provided above a carbon nanotube 2 through an insulating layer 6 so as to form a field effect transistor structure.

Figure 7:
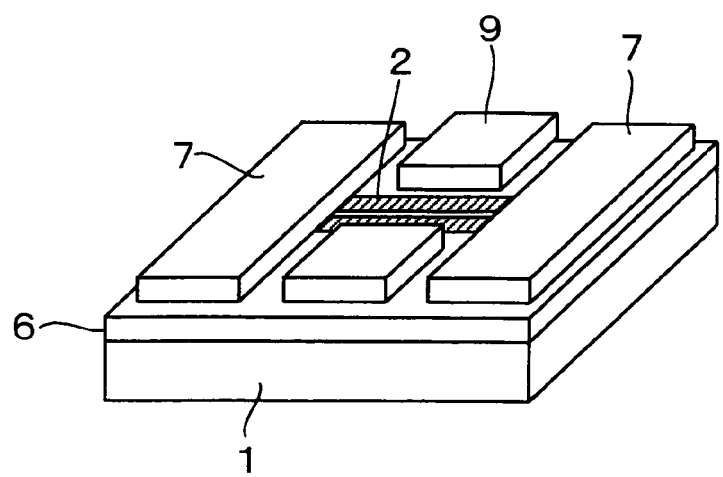
FIG. 7 is a perspective view of an optical sensor according to the fifth embodiment of the present invention.

FIG. 7 is a perspective view of an optical sensor for explaining the fifth embodiment of the present invention. In this embodiment, a gate electrode 9 is provided above an insulating layer 6 and near a carbon nanotube 2 so as to form a field effect transistor structure.

When the gate electrode 9 is formed on the photoconductive material 1 or the carbon nanotube 2 so as to form a field effect transistor structure as in the aforementioned embodiments, a change of a current flowing through the carbon nanotube 2 by irradiation with light or an electromagnetic wave can be increased.

When a carbon nanotube single-electron transistor for limiting the number of carriers flowing into the carbon nanotube to one by one is used as the carbon nanotube, a dark current can be reduced to increase the sensitivity so that a single photon can be measured.

Although the photoconductive material can be present under the carbon nanotube, the photoconductive material may be present above the carbon nanotube. When a formation method based on application is used, an optical sensor can be manufactured easily and simply. In this case, when the photoconductive material dissolved in resin etc. is applied, the optical sensor can be produced more easily. The aforementioned resin functions as abider. Transparent resin such as acrylic resin, epoxy resin, etc. is preferable. When the layer of the photoconductive material 1 is colored, a function as a color filter for limiting the sensitive wavelength range can be provided.

Figure 8:
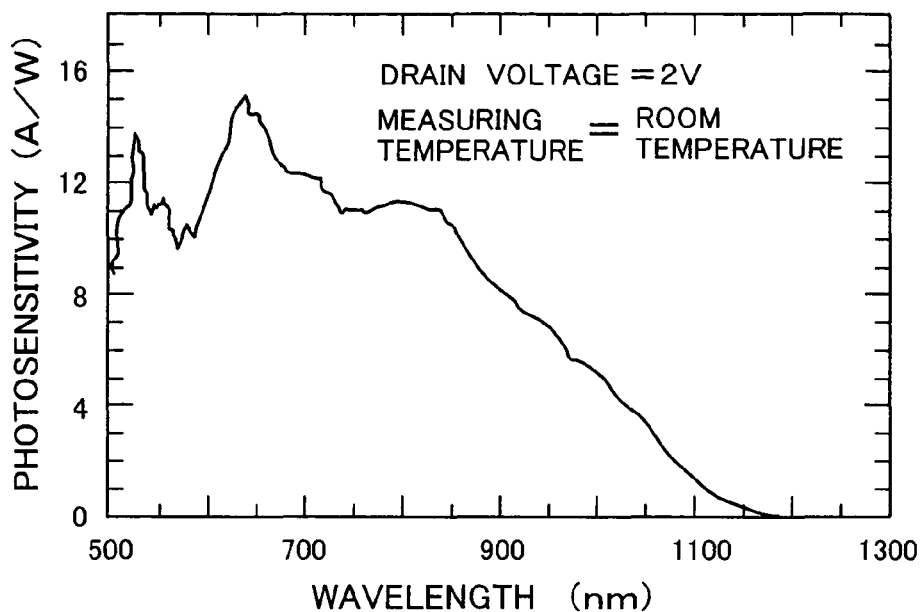
FIG. 8 is a graph showing an example of a wavelength-sensitivity characteristic of an optical sensor according to an embodiment of the present invention.

FIG. 8 is a graph showing an example of the wavelength-sensitivity characteristic at a room temperature in the optical sensor (see FIGS. 2 and 3) according to the first embodiment. Here, silicon and silicon oxide were used as the photoconductive material 1 and the insulating layer 6, respectively, and the carbon nanotube 2 was formed on the insulating layer 6. A proper voltage (drain voltage of 2 V in this embodiment) was applied between the two electrodes 7 and 7 formed in the opposite ends of the carbon nanotube 2. Photosensitivity obtained from a change of a current flowing into the carbon nanotube 2 at that time is illustrated with respect to the wavelength of light with which the photoconductive material 1 was irradiated.

The photosensitive wavelength shown in this graph is that of silicon. The light intensity reaches 15 A/W near the wavelength of 600 nm. The optical sensor shows very high photosensitivity about 20 times as high as that of a background-art silicon photodiode.

Figure 9:
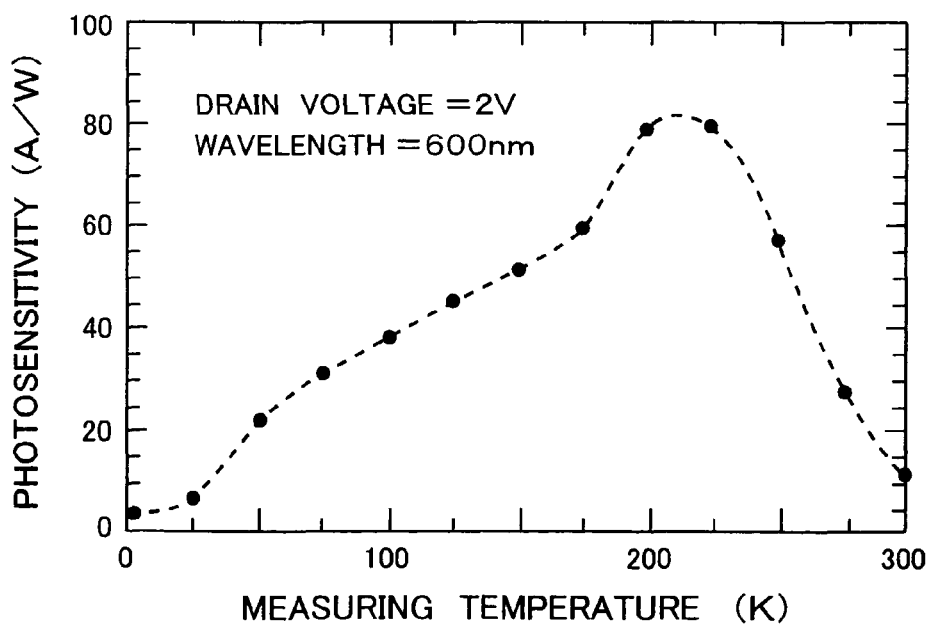
FIG. 9 is a graph showing an example of a temperature-sensitivity characteristic of an optical sensor according to an embodiment of the present invention.

FIG. 9 is a graph showing an example of the temperature-sensitivity characteristic of this optical sensor. As for the measuring conditions at this time, the drain voltage was set at 2 V, and light with a wavelength of 600 nm was used to measure the photosensitivity in each temperature. As shown in FIG. 9, higher photosensitivity can be obtained by adjusting the measuring temperature of this optical sensor, and the photosensitivity can be increased to 60 A/W or higher by adjusting the measuring temperature to a range of 175-250 K. Particularly by adjusting the measuring temperature to a range of 200-225 K, the photosensitivity can be increased to 80 A/W. When similar measurement was performed in FIGS. 2 and 3 while perfectly preventing the carbon nanotube from being exposed to light, a similar result could be obtained.

In a structure which was the same as that in FIGS. 2 and 3 except that the carbon nanotube 2 was not produced, no electric conduction was observed, and no action as an optical sensor was shown.

In the optical sensor according to the present invention, for example, as shown in FIG. 6 or 7, a gate electrode may be formed near the carbon nanotube so as to form a field effect transistor structure. In this manner, the number of electrons in the photoconductive material or the carbon nanotube can be controlled to adjust the drain current or the photocurrent. Thus, the sensitivity of the optical sensor can be adjusted.

Figure 10:
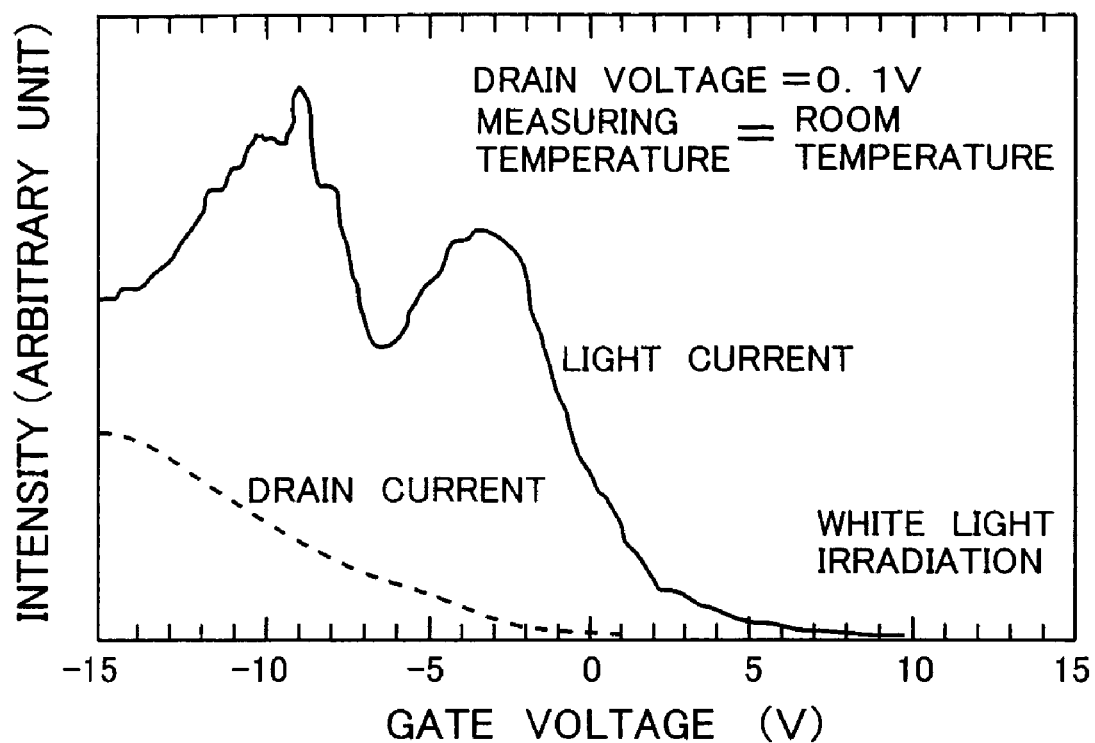
FIG. 10 is a graph showing an example of a gate voltage characteristic of an optical sensor according to an embodiment of the present invention.

FIG. 10 is a characteristic graph showing a change of the drain current and a change of the photocurrent at a room temperature when the gate voltage is varied in the optical sensor having a field effect transistor structure. As is apparent from this graph, when the gate voltage of the optical sensor having a field effect transistor structure is adjustable, high intensity can be obtained in the photocurrent so that the sensitivity can be enhanced.

Figure 11:
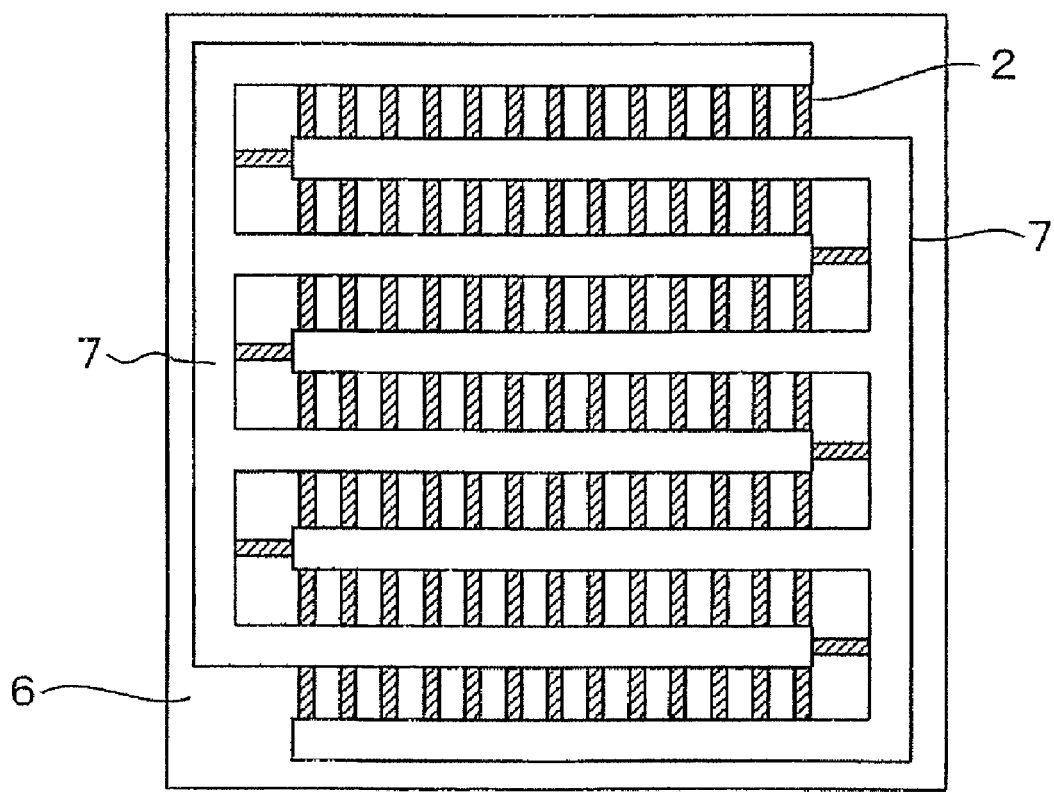
FIG. 11 is a plan view of an optical sensor according to the sixth embodiment of the present invention.

A plurality of optical sensors according to the present invention can be connected in series or in parallel easily. It is, therefore, possible to increase the output power further. FIG. 11 is a plan view of an optical sensor for explaining the sixth embodiment of the present invention. In this embodiment, two comb-like electrodes 7 and 7 are provided on an insulating layer 6 so as to be opposed to each other, and a large number of carbon nanotubes 2 are connected in parallel between the electrodes 7 and 7. In this manner, the output of the optical sensor can be increased.

Figure 12:
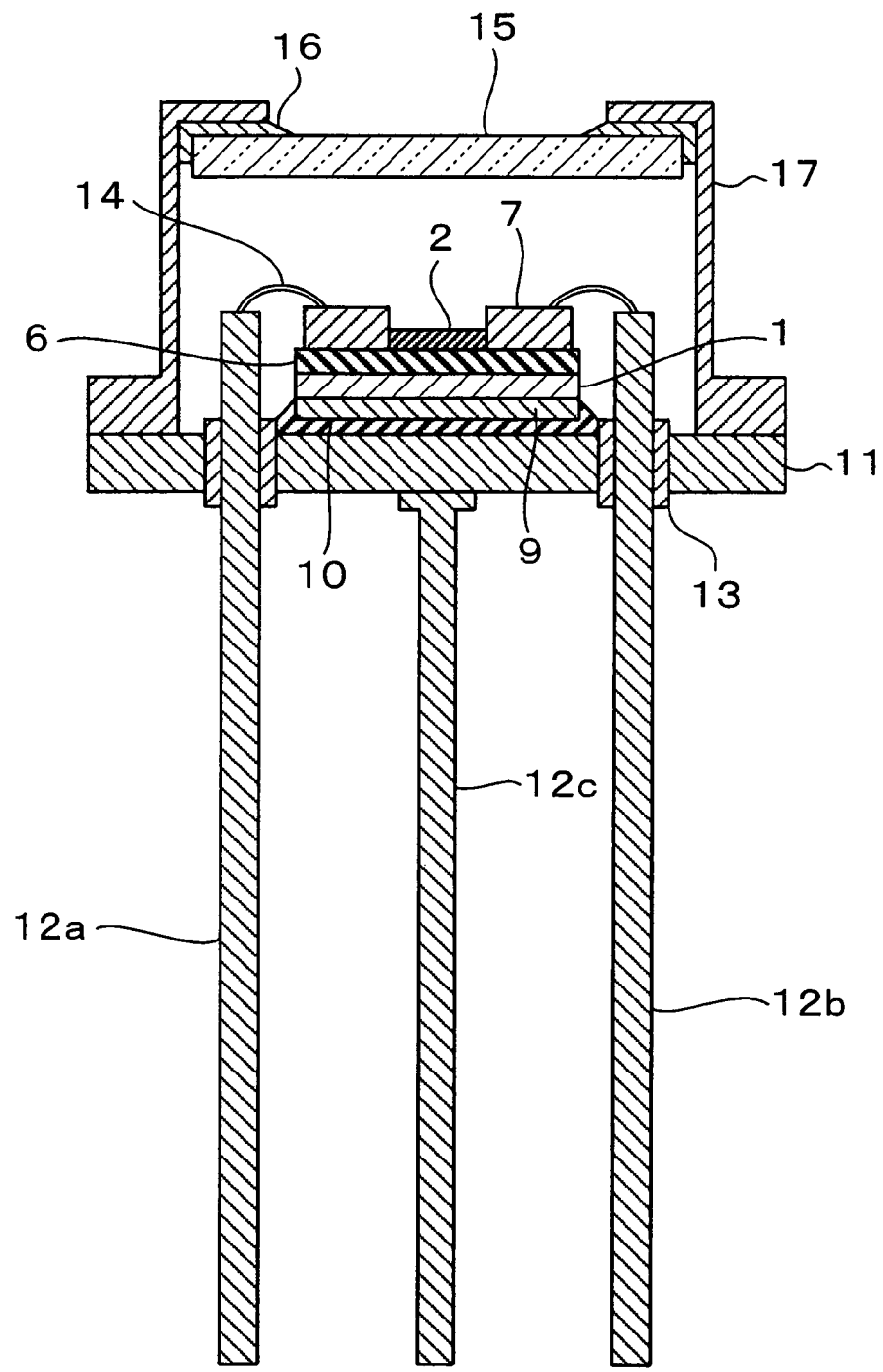
FIG. 12 is a sectional view of an optical sensing device according to the seventh embodiment of the present invention.

FIG. 12 is a sectional view of an optical sensing device for explaining the seventh embodiment of the present invention. This embodiment shows a more specific structure using the optical sensor according to the aforementioned embodiment. The optical sensor is fixedly bonded onto a stem 11. A plurality of lead electrodes 12a-c for connecting with an external circuit are supported on this stem 11. The electrodes 7 of the optical sensor and the lead electrodes 12a and 12b are electrically connected through lead lines 14. The optical sensor on the stem 11 is covered with a protective cap 17 to which a window 15 is fixed by a bonding agent 16. A lower portion of the cap 17 is fixedly welded or bonded with the stem 11.

When a space surrounded by this cap 17 with the window 15 and the step 11 is evacuated (decompressed) or filled with inert gas such as nitrogen gas, argon gas or the like, the durability of the optical sensor can be increased so as to be stabilized.

In this embodiment, the optical sensor having a gate electrode 9 in its bottom is used, and the gate electrode 9 is fixed to the metal stem 11 through a conductive paste 10, while the lead electrode 12c is fixed directly to the stem 11. Thus, the gate electrode 9 is electrically connected to the lead electrode 12c through the conductive paste 10 and the metal stem 11. In this embodiment, the metal stem 11 is electrically insulated from each lead electrode 12a, 12b by an insulator 13.

Figure 13:
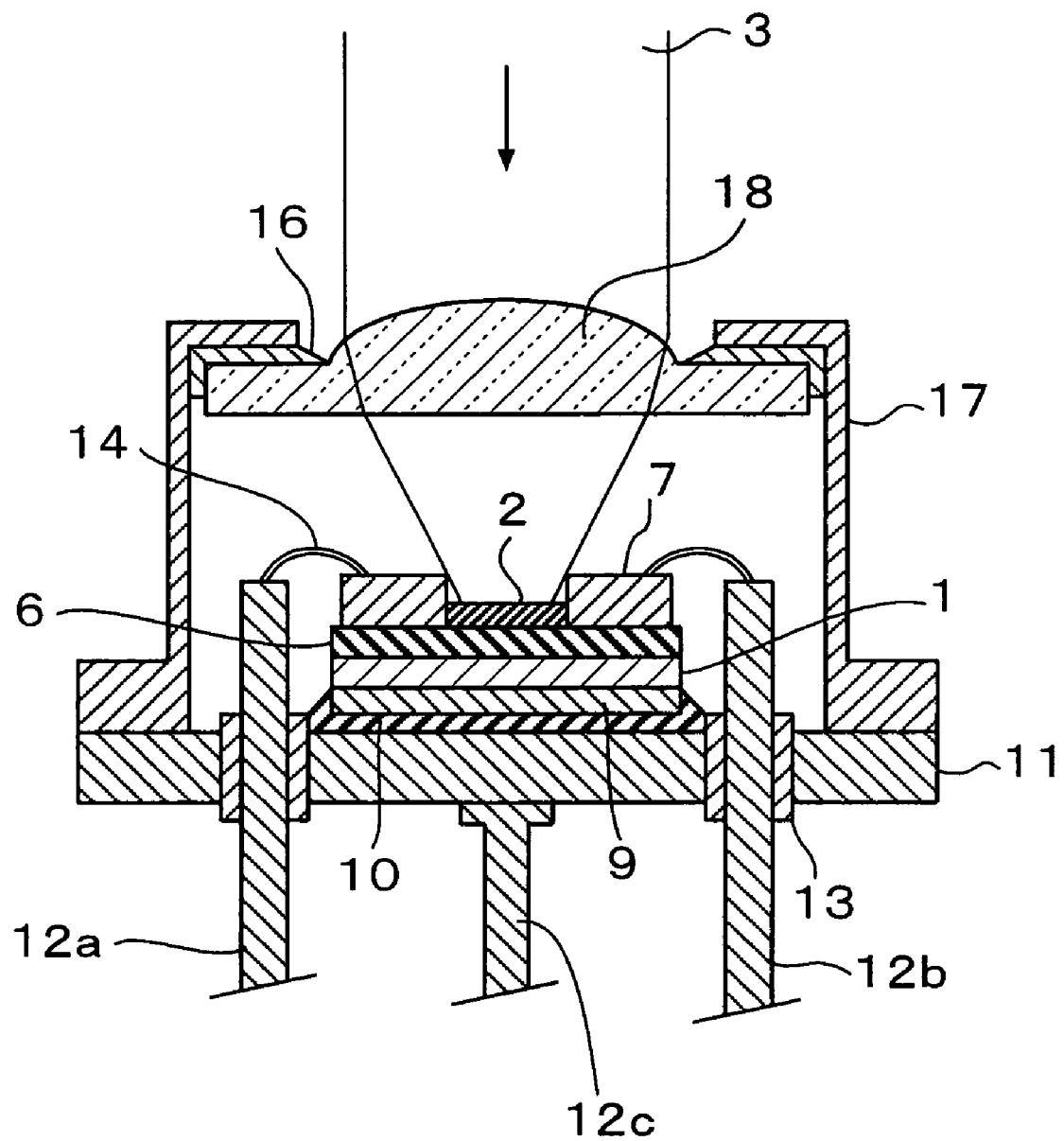
FIG. 13 is a sectional view of an optical sensing device according to the eighth embodiment of the present invention.

FIG. 13 is a sectional view of an optical sensing device for explaining the eighth embodiment of the present invention. In this embodiment, a part or all of the aforementioned window 15 is composed of a lens body 18. A convex portion of the lens body 18 may be located in the lower surface or in both the upper and lower surfaces.

Figure 14:
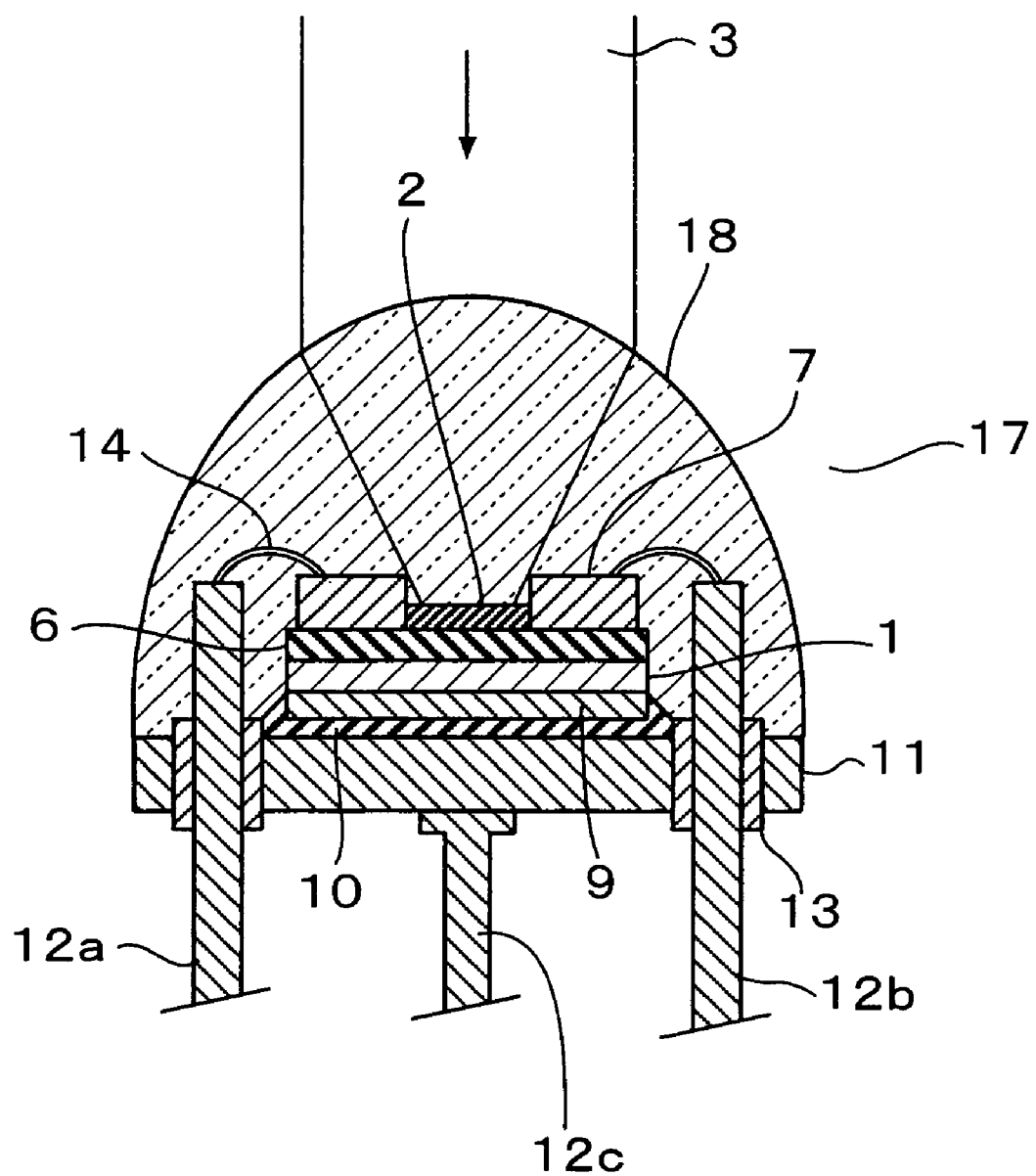
FIG. 14 is a sectional view of an optical sensing device according to the ninth embodiment of the present invention.

FIG. 14 is a sectional view of an optical sensing device for explaining the ninth embodiment of the present invention. In this embodiment, an optical sensor on a stem 11 is sealed in transparent synthetic resin, the shape of which is formed into a lens body 18. When the lens body 18 is used thus, a greater amount of light 3 can be collected in a light receiving portion of the optical sensor so that the photosensitivity can be increased. In addition, when the optical sensor is sealed in the synthetic resin, the durability of the optical sensor can be increased so as to be stabilized.

A plurality of optical sensors according to the present invention can be connected in series or in parallel easily. Accordingly, they can be also used as a one-dimensional, two-dimensional or three-dimensional image sensor.

Figure 15:
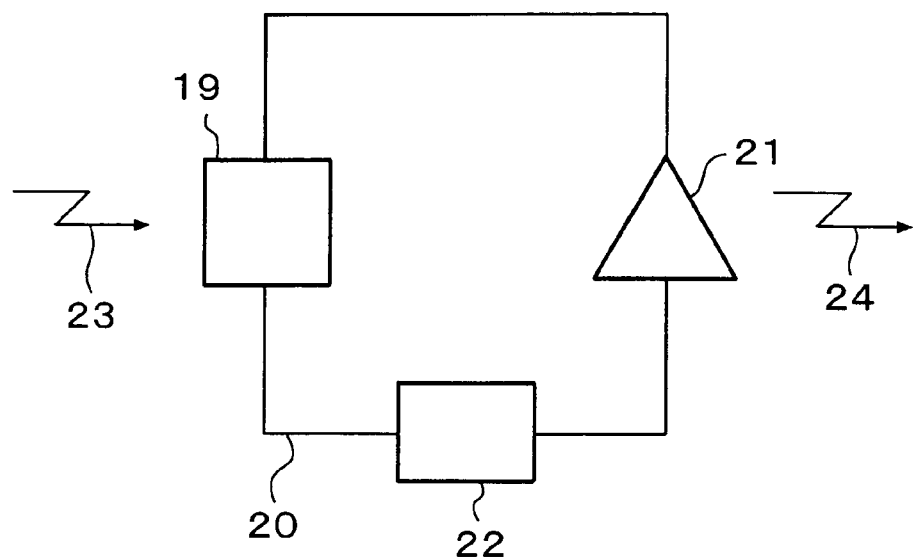
FIG. 15 is a schematic configuration diagram of a light signal processing circuit using an optical sensor according to an embodiment of the present invention.

Further, since a large output current can be secured, the light emitter 21 can be driven directly without intermediacy of an amplifier as shown in FIG. 15, where a light emitter 21 such as a light emitting diode etc. and a power supply 22 only are connected to an optical sensor 19 according to the present invention through a lead line 20.

Figure 16:
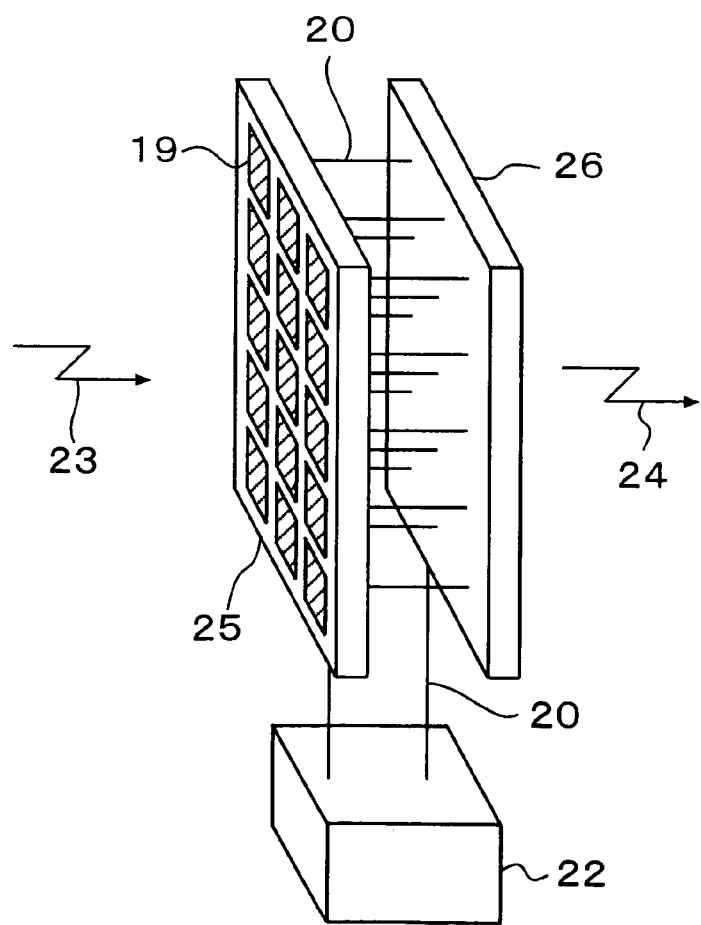
FIG. 16 is a schematic configuration diagram showing an example in which optical sensors according to an embodiment of the present invention are used in an image sensor.

In this event, a light output 24 can be made larger than a light input 23. Therefore, the optical sensing device can be used as a night-vision camera, or as a two-dimensional light amplifier or image amplifier or an optical memory as shown in FIG. 16 for applications to analog or digital optical signal processing circuits. In FIG. 16, the reference numeral 25 represents an image sensor having a large number of optical sensors 19 arrayed two-dimensionally, and 26 represents a display connected to the image sensor 25 (optical sensors 19) through lead lines 20.

When a photoconductive material is selected desirably in an optical sensor according to the present invention, the optical sensor can be designed to respond to light or electromagnetic waves in a desired wavelength. Further, when the size, number or length of a carbon nanotube is controlled desirably, the optical sensor can be designed to have a desired multiplication factor.

Although a carbon nanotube is formed in parallel to the surface in the aforementioned embodiments, an optical sensor may be designed as a vertical structure in which a carbon nanotube is buried vertically. In that case, the optical sensor can be laminated to another device easily.

The carbon nanotube does not have to be provided in a central portion of the sensor. The carbon nanotube may be close to an end of the sensor. The carbon nanotube does not have to have a linear shape, either. The carbon nanotube may be curved, for example, like a waved shape, a spiral shape or the like.

When a large number of carbon nanotubes are arranged in parallel, not only does the sensitivity increase, but the total resistance also becomes low. It is, therefore, possible to increase electric current that can flow in carbon nanotubes. In this event, the carbon nanotubes may cross one another or branch.

Although the aforementioned embodiments show the case where a carbon nanotube is formed on silicon through silicon oxide, similar sensors can be produced using any photoconductive material if it is a photoconductive material that can generate carriers inside in accordance with irradiation with light or electromagnetic waves whether it is an insulator, a dielectric, a magnetic material, or an n-type or p-type semiconductor. Such photoconductive materials include not only single elements such as silicon, germanium, etc., but also ones using compounds such as gallium arsenide, indium gallium arsenide, indium phosphide, etc., ones based on a monolayer structure or a multilayer structure formed by a quantum well structure or a hetero-junction structure of those photoconductive materials, combinations with other materials, and so on.

Particularly when a multilayer structure of a plurality of kinds of photoconductive materials having different sensitive wavelength ranges is used as in the second embodiment shown in FIG. 4, a wide wavelength range can be sensed by a single optical sensor.

When a multilayer structure is used, epitaxial growth is not necessary. Thus, the range of selection as to materials is expanded. Accordingly, not only is it easy to form the photoconductive materials in a multilayer structure, but it is also possible to increase the operation speed when the photoconductive materials are made polycrystalline or amorphous to increase the relaxation rate of carriers.

The multilayer structure does not have to be placed horizontally, but it may be disposed vertically. The multilayer structure does not have to be a lamellar structure, but it may be formed as a three-dimensional structure if it is a multilayer structure.

The insulating layer 6 is not always required in the aforementioned embodiments. However, when the insulating layer 6 is provided, there is an effect of reducing a dark current. Although silicon oxide is used as the insulating layer 6 in the aforementioned embodiments, other materials such as silicon nitride, transparent or translucent glass or resin, etc. can be also used. Further, semiconductor materials substantially containing no impurities, such as non-doped gallium arsenide, non-doped aluminum arsenide, etc. may be used as long as they are thin.

In the aforementioned embodiments, it will go well if the electrodes 7 for connecting to the outside abut against the carbon nanotube 2. The electrodes 7 do not have to be electrically connected to the photoconductive material 1.

The present invention is applicable to various kinds of technical fields, such as high sensitive optical sensors, optical switching devices, one-dimensional, two-dimensional or three-dimensional image sensors based on arrayed optical sensors, precision measuring apparatuses using the image sensors, high sensitive cameras, night-vision cameras, position sensors in photo-couplers, photo-interruptors, etc. based on combination with light emitters, light amplifiers for light arithmetic circuits, and so on.

The invention claimed is:

1. An optical sensor characterized by comprising a photoconductive material layer, which generates a carrier inside when irradiated with a light or an electromagnetic wave, and a transparent or translucent insulating layer formed on said photoconductive material layer, and a carbon nanotube formed on said insulating layer, and electrodes connected to opposite ends of said carbon nanotube, wherein;

said photoconductive material layer is irradiated with said light or electromagnetic wave through said transparent or translucent insulating layer;

a predetermined voltage is applied between said two electrodes, and said carrier, which is generated within said photoconductive material layer by irradiation of said light or electromagnetic wave, is sensed through change of electrical conduction of said carbon nanotube.

2. An optical sensor according to claim 1, characterized in that said photoconductive material layer comprises by comprising a single layer structure or a multilayer structure, where said single layer structure or said multilayer structure is made of a plurality of kinds of photoconductive materials having photoconductivity in different wavelength ranges.

3. An optical sensor according to claim 1, characterized in that said optical sensor has a field effect transistor structure or a single electron transistor structure.

4. An optical sensor according to claim 1, characterized in that said electrodes have a comb-like shape and are disposed on said transparent or translucent insulating layer to be opposed to each other, while a large number of carbon nanotubes including said carbon nanotube are connected in parallel between said two electrodes.

5. An optical sensor according to claim 1, characterized in that a condenser is disposed on a side where said optical sensor is irradiated with said light or electromagnetic wave.

6. An optical sensor according to claim 2, characterized in that said multilayer structure includes layers of a photoconductive material having a wider energy gap at the side of said transparent or translucent insulating layer.

7. An optical sensor according to claim 2, characterized in that said optical sensor has a field effect transistor structure or a single electron transistor structure.

8. An optical sensor according to claim 2, characterized in that said electrodes have a comb-like shape and are disposed on said transparent or translucent insulating layer to be opposed to each other, while a large number of carbon nanotubes including said carbon nanotube are connected in parallel between said two electrodes.

9. An optical sensor according to claim 2, characterized in that a condenser is disposed on a side where said optical sensor is irradiated with said light or electromagnetic wave.

10. An optical sensor according to claim 6, characterized in that said optical sensor has a field effect transistor structure or a single electron transistor structure.

11. An optical sensor according to claim 6, characterized in that said electrodes have a comb-like shape and are disposed on said transparent or translucent insulating layer to be opposed to each other, while a large number of carbon nanotubes including said carbon nanotube are connected in parallel between said two electrodes.

12. An optical sensor according to claim 3, characterized in that said field effect transistor structure is a structure in which a gate electrode is provided under said photoconductive material layer.

13. An optical sensor according to claim 3, characterized in that said field effect transistor structure is a structure in which a gate electrode is provided above said carbon nanotube through said transparent or translucent insulating layer.

14. An optical sensor according to claim 3, characterized in that said field effect transistor structure is a structure in which a gate electrode is provided near said carbon nanotube formed on said transparent or translucent insulating layer.

15. An optical sensor according to claim 3, characterized in that said electrodes have a comb-like shape and are disposed on said transparent or translucent insulating layer to be opposed to each other, while a large number of carbon nanotubes including said carbon nanotube are connected in parallel between said two electrodes.

* * * * *